United States Patent
Beach et al.

(10) Patent No.: US 8,193,612 B2
(45) Date of Patent: Jun. 5, 2012

(54) COMPLIMENTARY NITRIDE TRANSISTORS VERTICAL AND COMMON DRAIN

(75) Inventors: Robert Beach, Altadena, CA (US); Paul Bridger, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/056,689

(22) Filed: Feb. 11, 2005

(65) Prior Publication Data

US 2005/0179096 A1 Aug. 18, 2005

Related U.S. Application Data

(60) Provisional application No. 60/544,629, filed on Feb. 12, 2004.

(51) Int. Cl.
H01L 29/20 (2006.01)
H01L 31/0304 (2006.01)

(52) U.S. Cl. .......... 257/615; 257/329; 257/E21.643

(58) Field of Classification Search .......... 257/329, 257/615, E21.643
See application file for complete search history.

(56) References Cited

U.S. PATENT DOCUMENTS

| | | | |
|---|---|---|---|
| 5,283,456 A * | 2/1994 | Hsieh et al. | 257/347 |
| 5,296,403 A | 3/1994 | Nishizawa et al. | |
| 5,311,050 A * | 5/1994 | Nitayama et al. | 257/330 |
| 5,502,321 A | 3/1996 | Matsushita | |
| 5,504,359 A * | 4/1996 | Rodder | 257/329 |
| 5,696,008 A * | 12/1997 | Tamaki et al. | 438/212 |
| 5,705,830 A | 1/1998 | Siergiej et al. | |
| 5,897,354 A | 4/1999 | Kachelmeier | |
| 6,147,379 A | 11/2000 | Hori et al. | |
| 6,184,553 B1 | 2/2001 | Odanaka et al. | |
| 6,362,504 B1 | 3/2002 | Simpson | |
| 6,396,085 B1 | 5/2002 | Yoshida | |
| 6,743,695 B2 * | 6/2004 | Lee et al. | 438/439 |
| 7,049,193 B2 * | 5/2006 | Maldei et al. | 438/241 |
| 7,211,839 B2 * | 5/2007 | Kachi et al. | 257/194 |
| 7,242,040 B2 * | 7/2007 | Sankin et al. | 257/263 |
| 7,354,782 B2 * | 4/2008 | Mishra et al. | 438/25 |

FOREIGN PATENT DOCUMENTS

| | | |
|---|---|---|
| EP | 0 700 093 | 8/1995 |
| JP | 5-326952 | 12/1993 |

(Continued)

OTHER PUBLICATIONS

Kohn, E:, "Transient Characteristics of GaN-Based Heterostructure Field-Effect Transistors",IEEE Trans. Microwave Theory and Tech., vol. 51, No. 2, p. 634-642.*
International Search Report dated Oct. 16, 2006 for PCT Application No. PCT/US05/04610.

(Continued)

Primary Examiner — Howard Weiss
(74) Attorney, Agent, or Firm — Farjami & Farjami LLP (57) ABSTRACT

A semiconductor device and a method for manufacturing the device are disclosed in which the semiconductor device includes ohmic contacts on different planes and the method for manufacturing the device includes etching a semiconductor stack of different conductivity semiconductor layers in successive steps to create a first opening of a first width in a first semiconductor layer to expose another semiconductor layer, and then a second opening of a narrower width in the another layer, whereby a portion of the another layer remains exposed for receiving an ohmic contact.

20 Claims, 6 Drawing Sheets

FOREIGN PATENT DOCUMENTS

| | | |
|---|---|---|
| JP | 7-99311 | 4/1995 |
| JP | 8116068 | 5/1996 |
| JP | 2003163354 | 6/2003 |
| JP | 2003-289142 | 10/2003 |

OTHER PUBLICATIONS

German Office Action dated Apr. 8, 2008 which issued in corresponding German Application No. 11 2005 000 335.3-33.

* cited by examiner

COMPLIMENTARY NITRIDE TRANSISTORS VERTICAL AND COMMON DRAIN

RELATED APPLICATION

This application is based on and claims the benefit of U.S. Provisional Application No. 60/544,629, filed Feb. 12, 2004, entitled COMPLIMENTARY NITRIDE TRANSISTORS VERTICAL AND COMMON DRAIN, to which a claim of priority is hereby made and the disclosure of which is incorporated by reference.

FIELD OF THE INVENTION

The present invention relates to semiconductor devices and more particularly to power semiconductor devices and methods for fabricating power semiconductor devices.

BACKGROUND OF THE INVENTION

Efficiency is an important parameter in power applications. In portable electronic device, for example, portable computers, efficiency allows for commercially desirable features such as a smaller battery pack and/or longer battery life. To improve the efficiency of the power supplies in electronic devices designers of power semiconductor devices have endeavored to increase the current carrying capability of the power semiconductor devices without increasing the On resistance value of the same in order to reduce power dissipation, while allowing for the power device to meet high power demands.

Improving the current carrying capability of the device is also advantageous as it allows for the efficient use of the semiconductor material, thereby reducing the cost of the same.

In addition to the current carrying capability certain structural features can improve material use. For example, in power semiconductor switching devices vertical gate design is preferred as it reduces the cell size and thus reduces material consumption. That is, it allows for a greater number of cells per unit area of material thereby reducing the cost of the power semiconductor device without sacrificing performance.

A very well known vertical gate design is a trench-type power semiconductor switching device (e.g. power MOSFET) in which the gate resides within a trench adjacent a base region. In such devices, typically one power electrical contact is formed over one major surface and another power electrical contact is formed over another opposing major surface. Thus, the current path in such devices is through the body of the device. While such devices handle power well, extracting heat from the same is often a design challenge. In addition, the position of the power contacts require packaging considerations that complicate manufacturing. For example, when a power semiconductor device includes two opposing contacts at least two steps are often required for connecting the power contacts to electrical leads of the package. It is, therefore, desirable to have all contacts on one surface. Such a design allows for electrical connection to relevant electrical contacts on one side (which during packaging can be carried out in a single step), while allowing for heat to be extracted from the other side by a heat spreader, heatsink or the like.

Semiconductor power devices which include power contacts on one side of the device and a vertically oriented gate structure are known. Such devices include the advantages described above. A drawback in such devices is that the current path must pass from one contact into the body of the device, under the gate structure and then up toward the second power contact. The long current path contributes to the On resistance of the device.

It is desirable to have a power semiconductor device which does not exhibit the disadvantages of the prior art.

SUMMARY OF THE INVENTION

A semiconductor device according to the present invention includes a conductive region of one conductivity, another conductive region of the one conductivity, a base region of another conductivity positioned between the conductive region and the another conductive region, a gate structure adjacent the base region, an ohmic contact ohmically connected to a surface of the conductive region, and another ohmic contact ohmically connected to a surface of the another conductive region. Each ohmic contact includes a contact surface for electrical connection to an external element by solder, wirebonding or the like. Both contact surfaces face the same direction such that electrical connection to the device can be made from the same side of the device.

According to one aspect of the present invention, the ohmic contacts are disposed on two different planes. That is, the ohmic contacts are not coplanar. As a result, the current path between the two contacts is shortened and consequently the On resistance of the device is improved compared to prior art devices.

A device according to the preferred embodiment of the present invention is a field effect transistor in which the conductive region is a source region and the another conductive region is a drain region. In the preferred embodiment, the conductive region, the another conductive region and the base region are comprised of a III-nitride semiconductor, such as, for example, GaN. The use of a III-nitride material such as GaN is desirable in that such materials exhibit high breakdown voltage characteristics, and high current carrying capability.

In a device according to another embodiment of the present invention the conductive region, the another conductive region and the base region are comprised of a semiconductor, and there is another conductive body formed of another semiconductor interposed between the gate structure and the base to improve mobility. In the preferred embodiment, the another semiconductor is comprised of AlGaN.

According to another aspect of the present invention a complementary semiconductor device includes a substrate, a first semiconductor device, and a second semiconductor device both disposed on the substrate. The first semiconductor device and the second semiconductor device each includes:

a conductive region;
another conductive region;
a base region of a conductivity opposite to the conductivity of the conductive region and the another conductive region positioned between the conductive region and the another conductive region;
a gate structure adjacent the base region;
an ohmic contact ohmically connected to a surface of the conductive region, the ohmic contact including a face for electrical connection which faces a direction; and
another ohmic contact ohmically connected to a surface of the another conductive region, the another contact including a face for electrical connection which faces the direction, in which the surface of the conductive region is on a first plane and the surface of the another conductive region is on another plane, and the conductive region and the another conductive region of the first device are of one conductivity and the conductive region and the another conductive region of the second device are of another conductivity.

In the preferred embodiment the first semiconductor device and the second semiconductor device are field effect transistors in which the conductive region in each semiconductor device is a source region and the another conductive region in each semiconductor device is a drain region. In the preferred embodiment, the conductive region, the another conductive region and the base region in each semiconductor device are comprised of a III-nitride semiconductor, such as, for example, GaN.

A method for manufacturing a device according to the present invention includes providing a semiconductor body having a stack of conductive semiconductor layers of different conductivity types, forming a first opening of a first width in the semiconductor body, the opening extending at least through one conductive semiconductor layer and terminating at least at another semiconductor layer, forming a second opening of a second width in the semiconductor body, the opening extending at least through the another conductive semiconductor layer, the second width being narrower than the first width, thereby exposing a portion of the another conductive semiconductor layer, forming a first ohmic contact on the exposed portion of the another conductive semiconductor layer, forming a second contact on a conductive semiconductor layer other than the another semiconductor conductive layer, the first contact and the second contact being disposed on different planes, but facing the same direction.

Advantageously, a method according to the present invention allows for the fabrication of PNP or NPN bipolar transistors, or N-channel or P-channel FETS on the same die. That is, it allows for the fabrication of complimentary integrated devices, which may be offset from one another in the vertical direction as well as the lateral direction.

Other features and advantages of the present invention will become apparent from the following description of the invention which refers to the accompanying drawings.

DETAILED DESCRIPTION OF THE FIGURES

Figure 1:
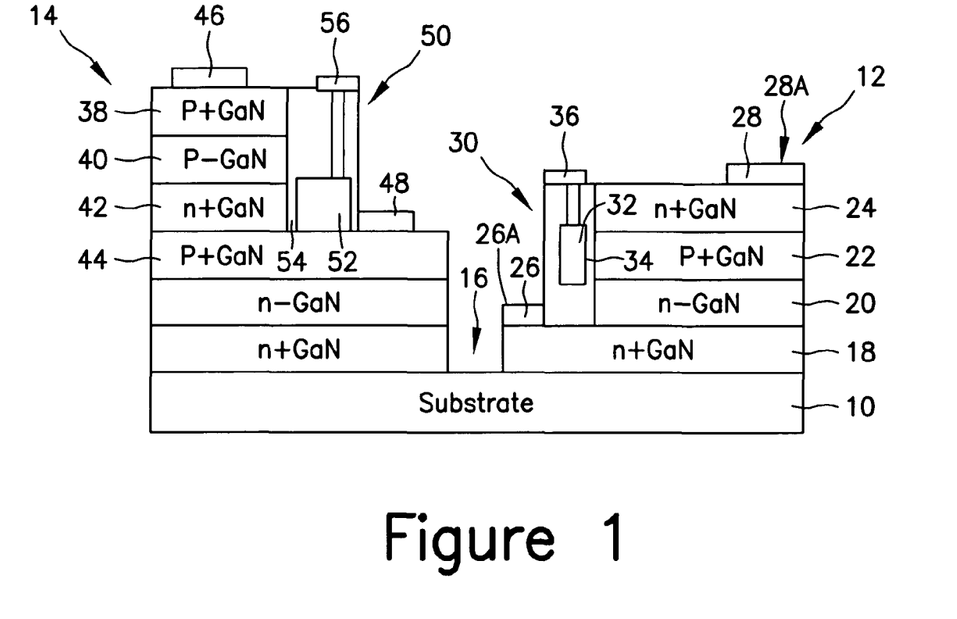
FIG. 1 shows a cross-sectional view of a portion of a device according to the first embodiment of the present invention.

Referring first to FIG. 1, a complimentary device according to the first embodiment of the present invention includes substrate 10, a first field effect transistor 12 formed on a first portion of a first major surface of substrate 10 and a second field effect transistor 14 formed on a second portion of the first major surface of substrate 10. In a device according to the first embodiment of the present invention, first field effect transistor 12 and second field effect transistor 14 are physically and electrically isolated from one another by opening 16.

According to one aspect of the present invention, first field effect transistor 12 is based on a III-nitride semiconductor. In the preferred embodiment, the III-nitride material used for forming first field effect transistor 12 is GaN. Specifically, first field effect transistor 12 includes first conductive region 18 which is composed of N+ GaN, second conductive region 20, which is composed of N− GaN, base region 22, which is composed of P+ GaN, and third conductive region 24, which is composed of N+ GaN. First conductive region 18 is the drain region, second conductive region 20 is the drift region and third conductive region 24 is the source region of first field effect transistor 12. First field effect transistor 12 further includes first ohmic contact 26, i.e. drain contact, which is ohmically connected to first conductive region 18, second ohmic contact 28, i.e. source contact, which is ohmically connected to fourth conductive region 24, and a gate structure 30. Gate structure 30 includes gate electrode 32, and gate insulation 34, which is interposed between gate electrode 32 and base region 22. Gate electrode 32 is electrically connected to gate contact 36.

In the preferred embodiment of the present invention, gate insulation 34 is composed of SiN, $Al_2O_3$, HfO, MgO or $SiO_2$, ohmic contacts 26, 28 can be composed of, for example, Ti, Al, Ni, Au, or any suitable metallic stack, such as a TiAl stack, gate contact 36 can be composed of any suitable conductive material such as TiW or NiAu, and gate electrode 32 can be composed of any suitable conductor.

According to the first aspect of the present invention, first ohmic contact 26 and second ohmic contact 28 each have a surface 26A, 28A which is adapted for external electrical connection, i.e. soldering, wirebonding or the like. Both surfaces 26A and 28A face the same direction, but are disposed on different planes and, therefore, are not coplanar. As a result, all contacts 26, 28, 36 of the device are on one side of the device, but the current path between first ohmic contact 26 and second ohmic contact 28 is reduced, whereby the ON resistance of the device is improved.

Second Field effect transistor 14 includes first conductive region 38, which is composed of P+ GaN, second conductive region 40, which is composed of P− GaN, base region 42, which is composed of N+ GaN, and third conductive region 44, which is composed of P+ GaN. First conductive region 38 is the drain region, the second conductive region 40 is the drift region, and third conductive region 44 is the source region of second field effect transistor 14. Second field effect transistor further includes first ohmic contact 46, i.e. drain contact, second ohmic contact 48, i.e. source contact, and gate structure 50. Gate structure 50 includes gate electrode 52, and gate insulation 54, which is interposed between gate electrode 52 and base region 42. Second field effect transistor 14 further includes gate contact 56, which is electrically connected to gate electrode 52.

As is readily apparent from the above description, first field effect transistor 12 and second field effect transistor 14 are complimentary devices in that each region in one is opposite in conductivity to a corresponding region in the other. Thus, first field effect transistor 12 includes a P type base region and is, therefore, an N channel device, while second field effect transistor 14 includes an N type base region, and is therefore, a P channel device.

To manufacture a device according to the present invention, a die 58 is provided, which includes substrate 10, and a stack 60 of conductive GaN layers. Specifically, stack 60 includes first N+ GaN layer 62, which is atop a first major surface of substrate 10, N− GaN layer 64, first P+ GaN layer 66, second N+ GaN layer 68, P− GaN layer 70, and second P+ GaN layer 72. Substrate 10 may be composed of any known substrate material such as Sapphire, SiC, or Si, and GaN layers 62-72 may be epitaxially formed atop one another to constitute stack 60 in any known manner.

Figure 2A:
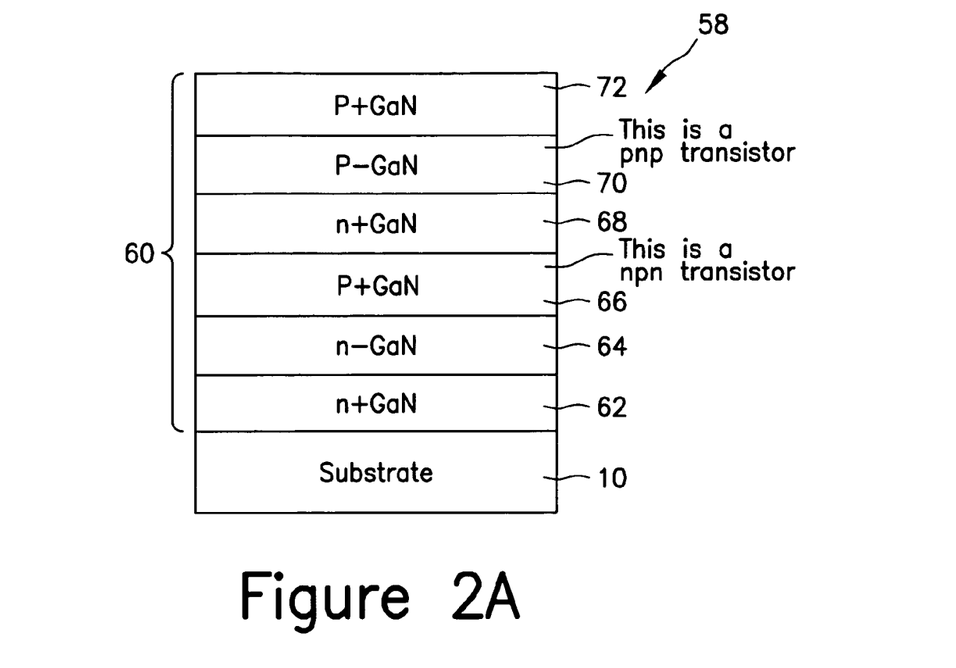
FIGS. 2A-2G illustrate steps in a method for manufacturing a device according to the present invention.
Figure 2B:
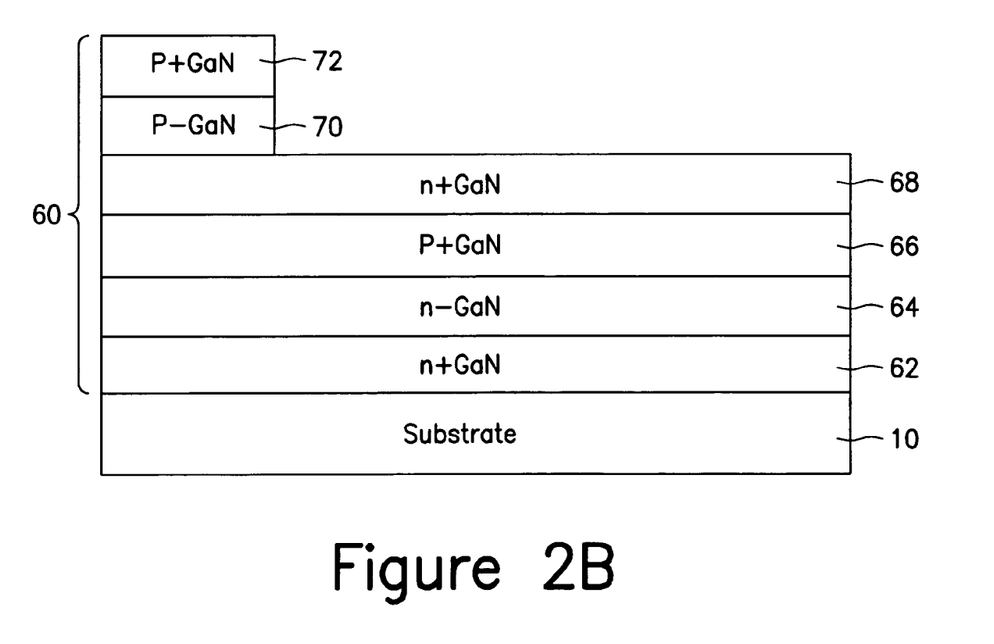
Figure 2C:
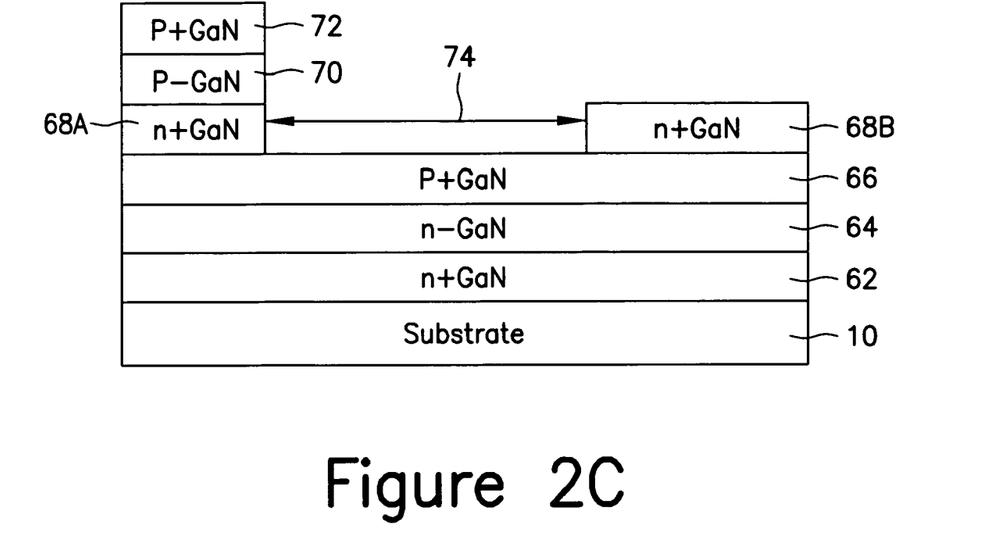

Referring next to FIG. 2A, in a first step, a portion of second P+ GaN layer 72 and a portion of P− GaN layer 70 are removed exposing second N+ GaN layer 68. Next, a portion of second N+ GaN layer 68 is removed exposing first P+ GaN layer 66, leaving a first portion of second N+ GaN layer 68 underneath P− GaN layer 70 and another portion of N+ GaN 68 spaced from the first portion as seen in FIG. 2C. That is, a portion of second N+ GaN layer 68 is removed to create opening 74 between one portion 68A thereof and another portion 68B thereof.

Figure 2D:
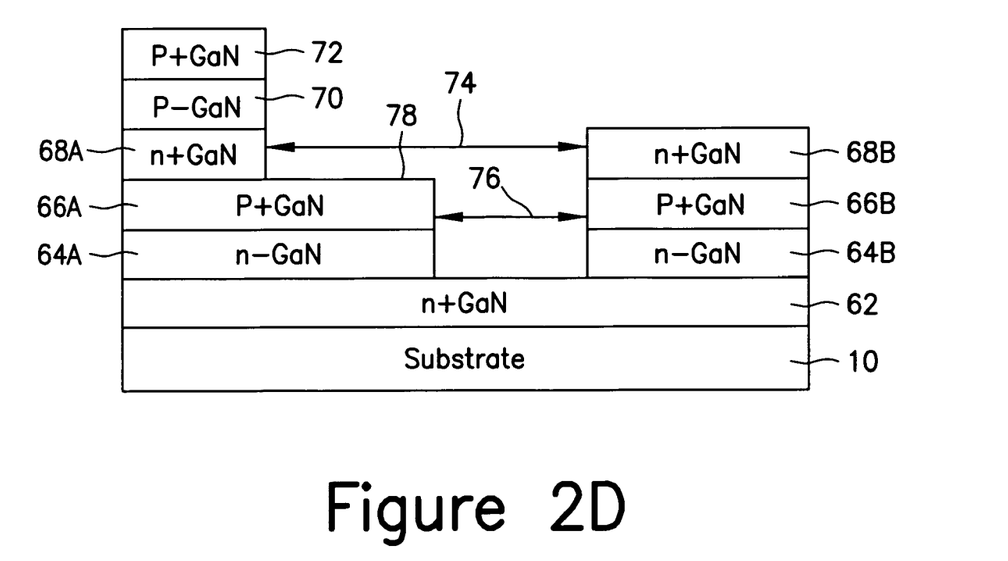

Referring next to FIG. 2D, a portion of first P+ GaN layer 66 and a portion of N− GaN layer 64 are removed creating opening 76 between first portion 66A and second portion 66B of first P+ GaN layer and first portion 64A and second portion 64B of N− GaN layer. Opening 76 has a width that is smaller than the width of opening 74 whereby first portion 66A of first P+ GaN layer 66 is left with an exposed surface 78.

Figure 2E:
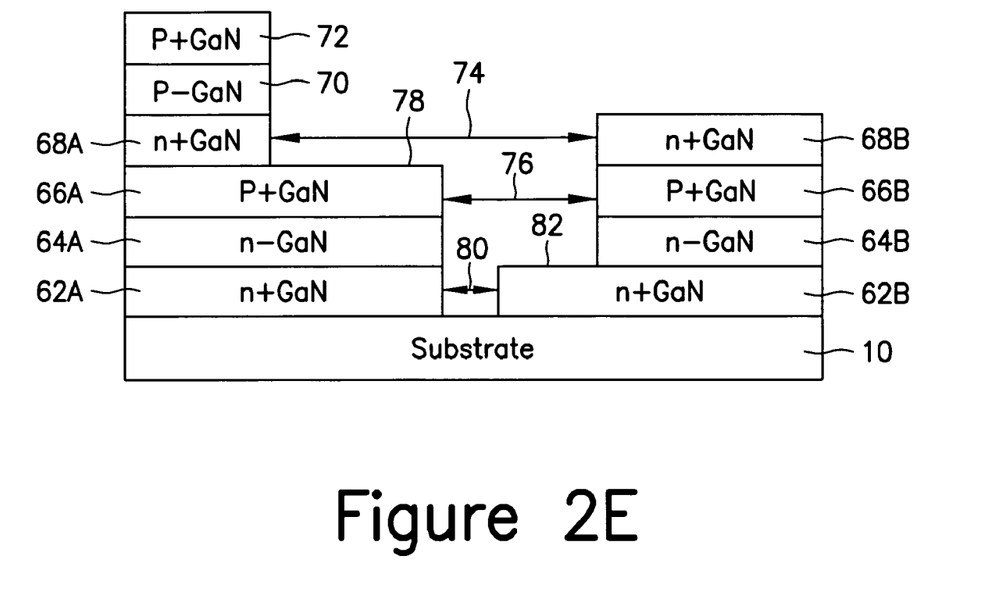

Referring next to FIG. 2E, a portion of first N+ GaN layer 62 is removed to create opening 80 between first portion 62A and second portion 62B of first N+ GaN layer. Opening 80 has a width that is smaller than the width of opening 76, whereby a surface 82 of second portion 62B of N+ GaN layer is left exposed through opening 76.

Figure 2F:
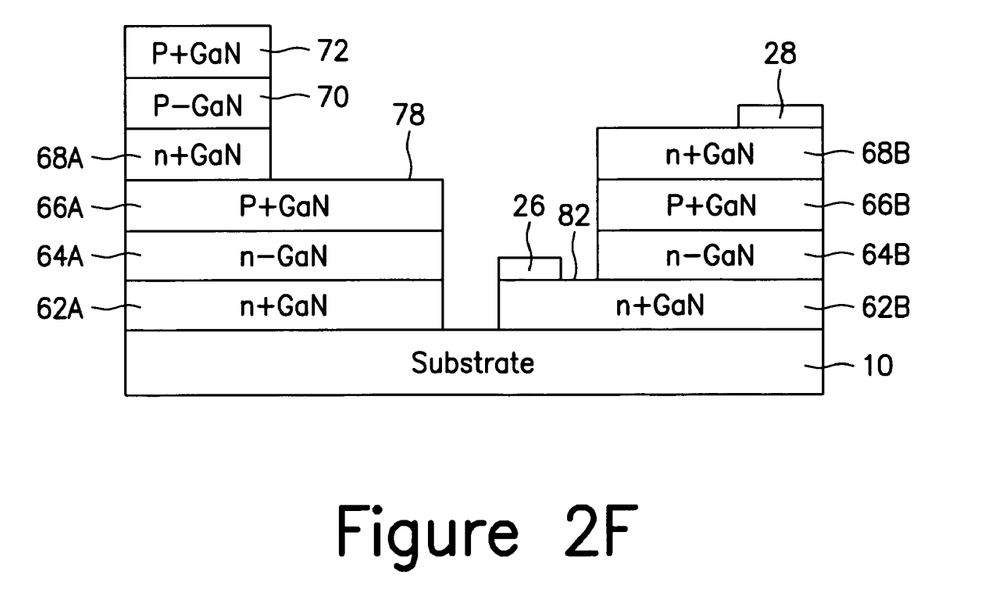

Referring next to FIG. 2F, first ohmic contact 26 is formed on surface 82 of second portion 62B of first N+ GaN layer, and second ohmic contact 28 is formed on second portion 68B of second N+ GaN layer, and then annealed.

Figure 2G:
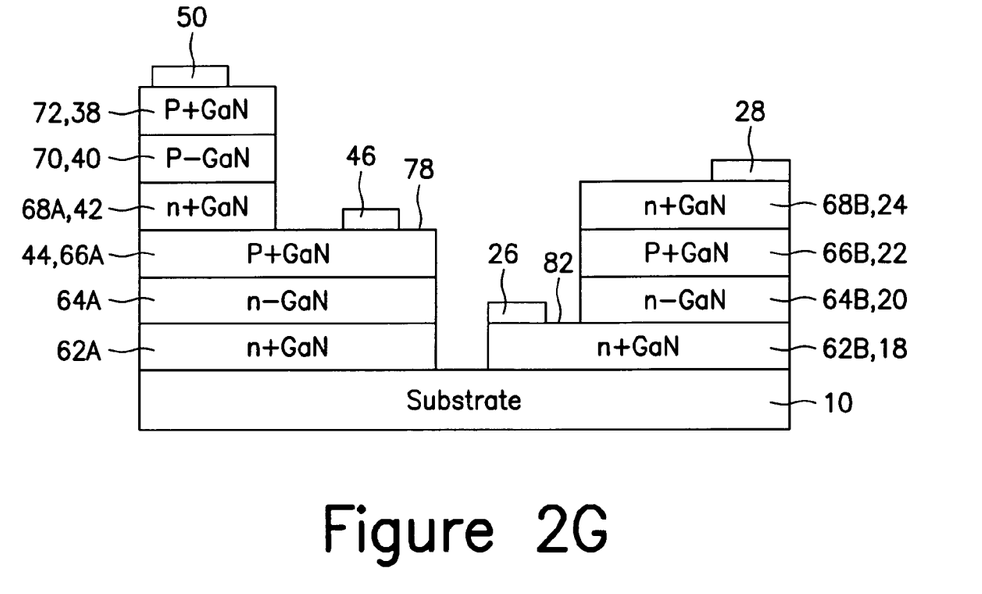

Referring next to FIG. 2G, first contact 46 of second field effect transistor 14 is formed over surface 78 of first portion 66A of first P+ GaN, and second ohmic contact 50 is formed over second P+ GaN layer. Thereafter, first contact 46 and second contact 50 are annealed. Next, gate structure 30 and gate structure 50 are formed to obtain a device according to the first embodiment of the present invention as seen in FIG. 1. To illustrate the relationship between the structure shown in FIG. 2G prior to the completion of the process and the final device, each region in FIG. 2G is also numbered with a number for a corresponding region in the final device as shown in FIG. 1.

In a method according to the present invention, a semiconductor body which includes a plurality of conductive semiconductor layers of different conductivities is etched in successive steps to form openings of varying widths in order to allow for the formation of ohmic contacts on different planes.

Figure 3:
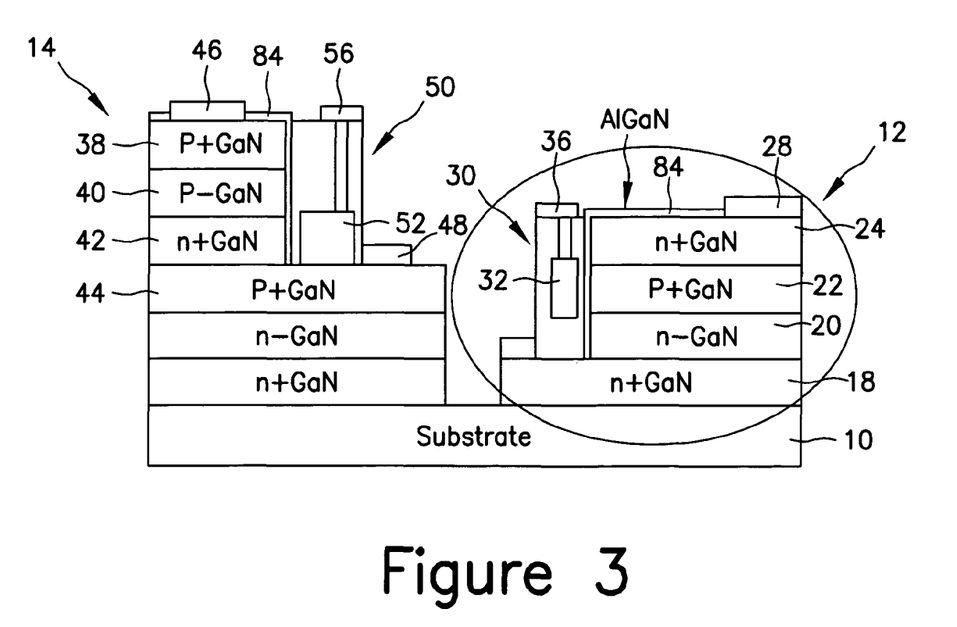
FIG. 3 illustrates a cross-sectional view of a portion of a device according to the second embodiment of the present invention.

Referring next to FIG. 3, a device according to the second embodiment of the present invention further includes a semiconductor layer 84 composed of a III-nitride material formed between each gate structure 30, 50 and an adjacent semiconductor stack. Thus, semiconductor layer 84 is interposed between gate structure 30 and the stack that includes second conductive layer 20, base layer 22, and third conductive region 24 of first device 12, and another semiconductor layer 84 is interposed between gate structure 50 and the stack that includes base region 42, second conductive region 40, and first conductive region 38 of second device 14. Semiconductor layer 84 further extends over the top semiconductor layer 24, 38 in each semiconductor stack.

Semiconductor layer 84 is preferably composed of a III-nitride material which has a higher band gap than the material on which it is formed. In the preferred embodiment, semiconductor layer 84 is composed of AlGaN. The inclusion of semiconductor layer 84 improves mobility.

To manufacture a device according to the second embodiment of the present invention, a layer of AlGaN is formed over the structure shown in FIG. 2E by an epitaxial method or the like. Thereafter, portions of the AlGaN are removed from surfaces 78, 82, and the bottom and sidewalls of opening 80. Preferably, in this same step openings are formed in the AlGaN layer over first conductive region 24 of the first field effect transistor 12 and third conductive region 38 of the second field effect transistor 14 for receiving respectively ohmic contact 28 and ohmic contact 46.

Figure 4:
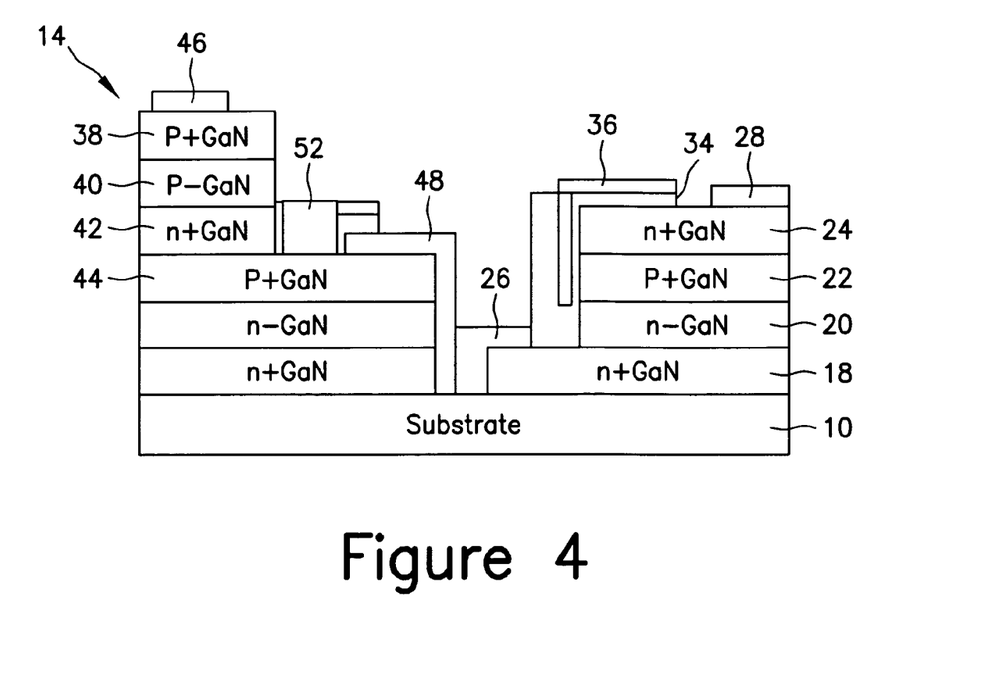
FIG. 4 illustrates a cross-sectional view of a portion of a device according to the third embodiment of the present invention.

Referring next to FIG. 4, in a device according to the third embodiment of the present invention, gate contact 36 is extended over third conductive region 24 of second field effect transistor 12. In order to insulate gate contact 36 from third conductive region 24, insulation 34 is extended over third conductive region 24 below gate contact 36. In addition, gate structure 50 of second field effect transistor 14 is reduced in thickness such that it is only slightly thicker than base region 42 of second field effect transistor 14, but not thick enough to reach first conductive region 38. Furthermore, ohmic contact 26, and ohmic contact 46 are extended over to the bottom of opening 80 and shorted to one another, whereby preferably opening 80 is filled.

Figure 5:
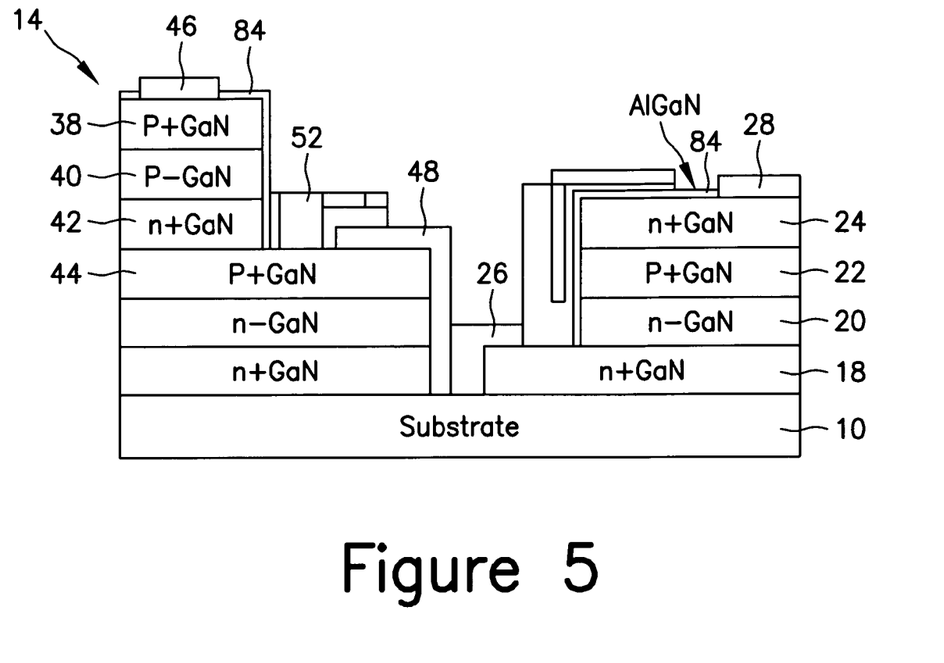
FIG. 5 illustrates a cross-sectional view of a portion of a device according to the fourth embodiment of the present invention.

Referring to FIG. 5, in a device according to the fourth embodiment of the present invention, a semiconductor layer 84 is formed over the same areas as those in a device according to the second embodiment. Semiconductor layer 84 is preferably composed of a III-nitride material having a higher band gap than the material on which it is formed. In the preferred embodiment of the present invention, semiconductor layer 84 is composed of AlGaN. In all other respects, a device according to the fourth embodiment of the present invention is the same as a device according to the third embodiment.

Figure 6:
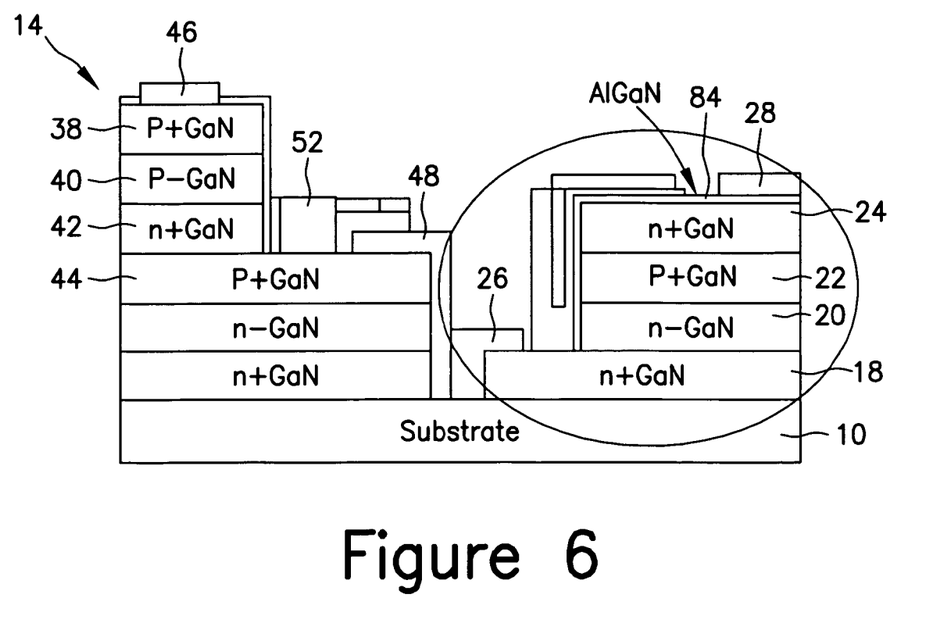
FIG. 6 illustrates a cross-sectional view of a portion of a device according to the fifth embodiment of the present invention.

Referring to FIG. 6, in a device according to the fifth embodiment, an opening 86 exists between ohmic contact 26 and gate structure 30. In addition, ohmic contact 28 is formed directly on semiconductor layer 84, rather than being directly formed on and connected to third conductive region 24. In all other respects a device according to the fifth embodiment of the present invention is the same as a device according to the fourth embodiment.

It should be noted that FIGS. 1, and 3-6 illustrate cross-sectional views of a portion of a device according to the present invention. Specifically, the cross-sectional views are taken along the body of a representative cell in a device according to the present invention. In a device according to the present invention the cells may have a variety of geometries including non-angular geometries such as circular, oval, or multi-sided geometries including square, rectangular, hexagonal, and the like.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:
1. A semiconductor device comprising:
  a stack including a source region, a base region, a drift region, and a drain region;
  a source contact connected to a surface of said source region through a first plane, and a drain contact con- nected to a surface of said drain region through a second plane, said first and second planes each facing a same direction; and a gate structure including a gate electrode and a connector, said gate electrode positioned adjacent said base region, said connector extending toward said same direction to electrically connect said gate electrode and a gate contact, said gate structure being between said base region and said drain contact, said drain contact extending laterally into an opening in said drain region and contacting an underlying substrate.

2. The semiconductor device of claim 1, wherein said gate electrode is positioned under said gate contact.

3. The semiconductor device of claim 1, wherein said gate structure comprises a gate insulator situated between said gate electrode and said base region.

4. The semiconductor device of claim 3, wherein said connector extends through said gate insulator to electrically connect said gate electrode and said gate contact.

5. The semiconductor device of claim 1, wherein said gate electrode is positioned above said drift region.

6. The semiconductor device of claim 1, wherein said stack comprises III-nitride material.

7. The semiconductor device of claim 1, wherein said source region, said drain region, and said base region each comprise GaN.

8. The semiconductor device of claim 1, wherein said gate structure is disposed on a same plane as one of said drain contact or said source contact.

9. The semiconductor device of claim 1, wherein said substrate is comprised of either sapphire, Si, or SiC.

10. The semiconductor device of claim 1, comprising a III-nitride material interposed between said gate structure and said base region and interposed between said gate structure and said source region to improve mobility.

11. A complementary semiconductor device comprising:
a first semiconductor device laterally adjacent to a second semiconductor device, said first and second semiconductor devices disposed on a substrate and each including:
    a stack including a source region, a drain region, a base region, and a drift region;
    a one ohmic contact connected to one of said source and drain regions, and another ohmic contact connected to the other of said source and drain regions; and
    a gate structure including a gate electrode, said gate electrode adjacent said base region;
    said one ohmic contact connected to said one of said source and drain regions through a first plane of said stack, said another ohmic contact connected to the other of said source and drain regions through a second plane of said stack, said first and second planes each facing a same direction;
said base region of said first semiconductor device of one conductivity type and said base region of said second semiconductor device of another conductivity type;
wherein said stacks of said first and second semiconductor devices are physically isolated from one another by a gap, said one ohmic contacts of said first and second semiconductor devices positioned in said gap and extending to a bottom of said gap and contacting said substrate.

12. The complementary semiconductor device of claim 11, wherein said one ohmic contact of said first semiconductor device is vertically offset from said one ohmic contact of said second semiconductor device in said gap.

13. The complementary semiconductor device of claim 11, wherein said gap includes a first opening defining said first plane of said first semiconductor device and a second opening defining said first plane of said second semiconductor device.

14. The complementary semiconductor device of claim 13, wherein said gap includes a third opening electrically isolating said first and second semiconductor devices.

15. The complementary semiconductor device of claim 11, wherein said one ohmic contacts of said first and second semiconductor devices are shorted to one another.

16. The complementary semiconductor device of claim 11, wherein said stack of said first and second semiconductor device each comprise III-nitride material.

17. The complementary semiconductor device of claim 11, wherein said gate structure of said first semiconductor device is disposed on a same plane as said another ohmic contact of said first semiconductor device.

18. The complementary semiconductor device of claim 11, including a substrate, said gap reaching said substrate.

19. The complementary semiconductor device of claim 11, wherein said first semiconductor device comprises a III-nitride material interposed between said gate structure and said base region and interposed between said gate structure and said source region to improve mobility.

20. The complementary semiconductor device of claim 11, wherein said for each of said first and second semiconductor devices, said gate electrode is positioned laterally between said one and another ohmic contacts.

* * * * *